United States Patent
Ikuma

(10) Patent No.: US 11,967,792 B2
(45) Date of Patent: Apr. 23, 2024

(54) COAXIAL CONNECTOR AND SUBSTRATE WITH COAXIAL CONNECTOR

(71) Applicants: AGC Inc., Tokyo (JP); AGC GLASS EUROPE, Louvain-la-Neuve (BE); AGC FLAT GLASS NORTH AMERICA, INC., Alpharetta, GA (US); AGC Vidros do Brasil Ltda., Sao Paulo (BR)

(72) Inventor: Yoshiyuki Ikuma, Tokyo (JP)

(73) Assignees: AGC Inc., Tokyo (JP); AGC GLASS EUROPE, Louvain-la-Neuve (BE); AGC FLAT GLASS NORTH AMERICA, INC., Alpharetta, GA (US); AGC Vidros do Brasil Ltda., Sao Paulo (BR)

(*) Notice: Subject to any disclaimer, the term of this patent is extended or adjusted under 35 U.S.C. 154(b) by 412 days.

(21) Appl. No.: 17/233,710

(22) Filed: Apr. 19, 2021

(65) Prior Publication Data
US 2021/0242641 A1    Aug. 5, 2021

Related U.S. Application Data

(63) Continuation of application No. PCT/JP2019/042530, filed on Oct. 30, 2019.

(30) Foreign Application Priority Data

Nov. 6, 2018 (JP) .................. 2018-208766

(51) Int. Cl.
*H01R 24/50* (2011.01)
*H01P 3/06* (2006.01)
(Continued)

(52) U.S. Cl.
CPC ............... *H01R 24/50* (2013.01); *H01P 3/06* (2013.01); *H01P 3/081* (2013.01); *H01P 5/085* (2013.01); *H01R 24/44* (2013.01)

(58) Field of Classification Search
CPC ........... H01R 24/44; H01R 24/50; H01P 3/06; H01P 3/081; H01P 5/085
(Continued)

(56) References Cited

U.S. PATENT DOCUMENTS

| 4,737,111 A | 4/1988 | Minar et al. |
| 5,404,117 A * | 4/1995 | Walz ............... H01P 5/085 333/260 |

(Continued)

FOREIGN PATENT DOCUMENTS

| CZ | 2010-833 A3 | 5/2012 |
| CZ | 303925 B6 * | 6/2013 |

(Continued)

*Primary Examiner* — Peter G Leigh
(74) *Attorney, Agent, or Firm* — Oblon, McClelland, Maier & Neustadt, L.L.P.

(57) ABSTRACT

A coaxial connector includes a base surface; a coaxial structure where a dielectric is between a central conductor and an outer conductor; and a protrusion protruding from the base surface. The central conductor includes a contact portion protruding from the base surface. In response to a substrate being inserted toward the base surface between the contact portion and the protrusion, the contact portion comes into contact with a conductor pattern formed on a surface of the substrate. The outer conductor includes a protruding conductor protruding from the base surface and not in contact with the substrate inserted between the contact portion and the protrusion.

12 Claims, 13 Drawing Sheets

(51) Int. Cl.
*H01P 3/08* (2006.01)
*H01P 5/08* (2006.01)
*H01R 24/44* (2011.01)

(58) Field of Classification Search
USPC .......................................................... 439/78
See application file for complete search history.

(56) References Cited

U.S. PATENT DOCUMENTS

| | | | | |
|---|---|---|---|---|
| 6,457,979 | B1* | 10/2002 | Dove | H01R 9/0515 |
| | | | | 439/63 |
| 7,946,854 | B2* | 5/2011 | Weidner | H01R 24/50 |
| | | | | 439/63 |
| 8,035,466 | B2* | 10/2011 | Payne | H01P 5/085 |
| | | | | 333/260 |
| 8,384,492 | B2* | 2/2013 | Cheng | H01P 5/085 |
| | | | | 333/260 |
| 9,532,492 | B2* | 12/2016 | Le Berre | H05K 9/0064 |
| 10,116,031 | B2* | 10/2018 | Li | H05K 1/116 |
| 2017/0352937 | A1* | 12/2017 | Li | H01P 11/001 |

FOREIGN PATENT DOCUMENTS

| | | | | |
|---|---|---|---|---|
| JP | 55-86204 | A | | 6/1980 |
| JP | 55086204 | A | * | 6/1980 |
| JP | 2003-208950 | A | | 7/2003 |
| JP | 2005236648 | A | * | 9/2005 |

\* cited by examiner

COAXIAL CONNECTOR AND SUBSTRATE WITH COAXIAL CONNECTOR

CROSS-REFERENCE TO RELATED APPLICATION

The present application is a continuation filed under 35 U.S.C. 111 (a) claiming the benefit under 35 U.S.C. 120 and 365 (c) of PCT International Application No. PCT/JP2019/042530 filed on Oct. 30, 2019, and designating the U.S., which is based on and claims priority to Japanese Patent Application No. 2018-208766 filed on Nov. 6, 2018. The entire contents of the foregoing applications are incorporated herein by reference.

BACKGROUND OF THE INVENTION

1. Field of the Invention

The present invention relates to a coaxial connector and a substrate with a coaxial connector.

2. Description of the Related Art

FIG. 1 is a exploded view of a configuration 18 of mounting a merchant coaxial RF connector of the edge mount, end launch to a substrate 10 disclosed in a patent document No. 1. The connector 25 has a base plate 3 through which a threaded end 2 protrudes, and the end 2 is formed to receive a corresponding male SMA connector. In the connector 25, a central conductor 4, and four mounting protrusions 5, 6, 7, and 8 extend from the base plate 3. A quasi-coaxial transmission line 9 formed on the substrate 10 has a strip of metal 13 formed on a top face of a dielectric material layer 12, and a metal layer 16 covering the dielectric material layer 12 and the strip of metal 13. The quasi-coaxial transmission line 9 extends to a position near an end of the substrate 10 (stops short of the end) to avoid an unintended connection between the strip of metal 13 and the base plate 3. The strip of metal 13 is exposed because the metal layer 16 is disposed not from the end of the substrate 10.

With this arrangement, lower portions of the mounting protrusions 5, 6 of the connector 25 are mounted at positions indicated by dotted lines 26, 19 of a grounding surface 11 of the substrate 10, and the central conductor 4 of the connector 25 is pressed against a position indicated by a dotted line 21 of the strip of metal 13. However, because the central conductor 4 and the strip of metal 13 have unshielded portions where an unwanted signal coupling can occur, a conductive shielding cover 22 is provided over the portions. The shielding cover 22 is fixed to areas, depicted in dotted lines 23 and 24, through soldering or the like.

CITATION LIST

Patent Literature

[PTL 1] Japanese Laid-open Patent Application No. 2003-208950

SUMMARY OF THE INVENTION

Technical Problem

However, the prior art technology uses the shielding cover, which is a separate part with respect to the coaxial connector, to shield portions between the substrate and the coaxial connector, making it difficult to make the electric potentials of the base plate and the shielding cover of the coaxial connector to be identical. As a result, propagation characteristics of a signal between the substrate and the coaxial connector may be degraded.

The present disclosure provides a coaxial connector as well as a substrate with a coaxial connector capable of avoiding a degradation in propagation characteristics of a signal.

Solution to Problem

According to the present disclosure,
a coaxial connector includes:
a base surface;
a coaxial structure where a dielectric is between a central conductor and an outer conductor; and
a protrusion protruding from the base surface.
The central conductor includes a contact portion protruding from the base surface,
  in response to a substrate being inserted toward the base surface between the contact portion and the protrusion, the contact portion comes into contact with a conductor pattern formed on a surface of the substrate, and
  the outer conductor includes a protruding conductor protruding from the base surface and not in contact with the substrate inserted between the contact portion and the protrusion.
In addition, according to the present disclosure,
a substrate with a coaxial connector includes:
the substrate; and the coaxial connector attached to the substrate.
The coaxial connector includes:
a base surface;
a coaxial structure where a dielectric is between a central conductor and an outer conductor; and
a protrusion protruding from the base surface.
The central conductor includes a contact portion protruding from the base surface,
  the contact portion is in contact with a conductor pattern formed on a surface of the substrate that is inserted toward the base surface between the contact portion and the protrusion, and
  the outer conductor includes a protruding conductor protruding from the base surface and not in contact with the substrate inserted between the contact portion and the protrusion.

Advantageous Effects of the Invention

According to the technologies of the present disclosure, a coaxial connector and a substrate with a coaxial connector capable of avoiding a degradation of propagation characteristics of a signal can be provided.

Other objects, features and advantages of the present invention will become more apparent from the following detailed description when read in conjunction with the accompanying drawings.

DETAILED DESCRIPTION OF THE PREFERRED EMBODIMENTS

Hereinafter, embodiments of the present disclosure will be described with reference to the drawings. In each embodiment, directions of parallel, perpendicular, orthogonal, horizontal, vertical, upward/downward, left/right, and the like are allowed to deviate from the exact directions to an extent not to impair the advantageous effects of the present invention. A X-axis direction, a Y-axis direction, and a Z-axis direction denote a direction parallel to an X-axis, a direction parallel to a Y-axis, and a direction parallel to a Z-axis, respectively. The X-axis direction, the Y-axis direction, and the Z-axis direction are orthogonal to each other. An XY-plane, a YZ-plane, and a ZX-plane denote a virtual plane parallel to the X-axis direction and the Y-axis direction, a virtual plane parallel to the Y-axis direction and the Z-axis direction, and a virtual plane parallel to the Z-axis direction and the X-axis direction, respectively.

According to each of the present embodiments, a coaxial connector and a substrate with a coaxial connector are used to propagate a signal in a high frequency band (e.g., 0.3-300 GHz), e.g., microwaves or millimeter waves. Such a high frequency band includes a 0.3-3 GHz UHF band, a 3-30 GHz SHF band, and a 30-300 GHz EHF band. Examples of a high-frequency device formed on a substrate with a coaxial connector according to each of the present embodiments include a planar antenna, a planar waveguide (a planar transmission line), and the like.

According to each of the present embodiments, a coaxial connector and a substrate with a coaxial connector may be used in, for example, a 5G mobile communication system, a wireless communication standard such as Bluetooth, or a wireless local area network (LAN) standard such as IEEE 802.11ac. A coaxial connector and a substrate with a coaxial connector according to each of the present embodiments, in a case of being used in a vehicle, may be used in an on-vehicle radar system for radar irradiation or in a V2X communication system for inter-vehicle communication, roadside-to-vehicle communication, or the like.

Next, a substrate with a coaxial connector in one comparative example will be described for comparison with a coaxial connector and a substrate with a coaxial connector according to each of the present embodiments.

Figure 1:
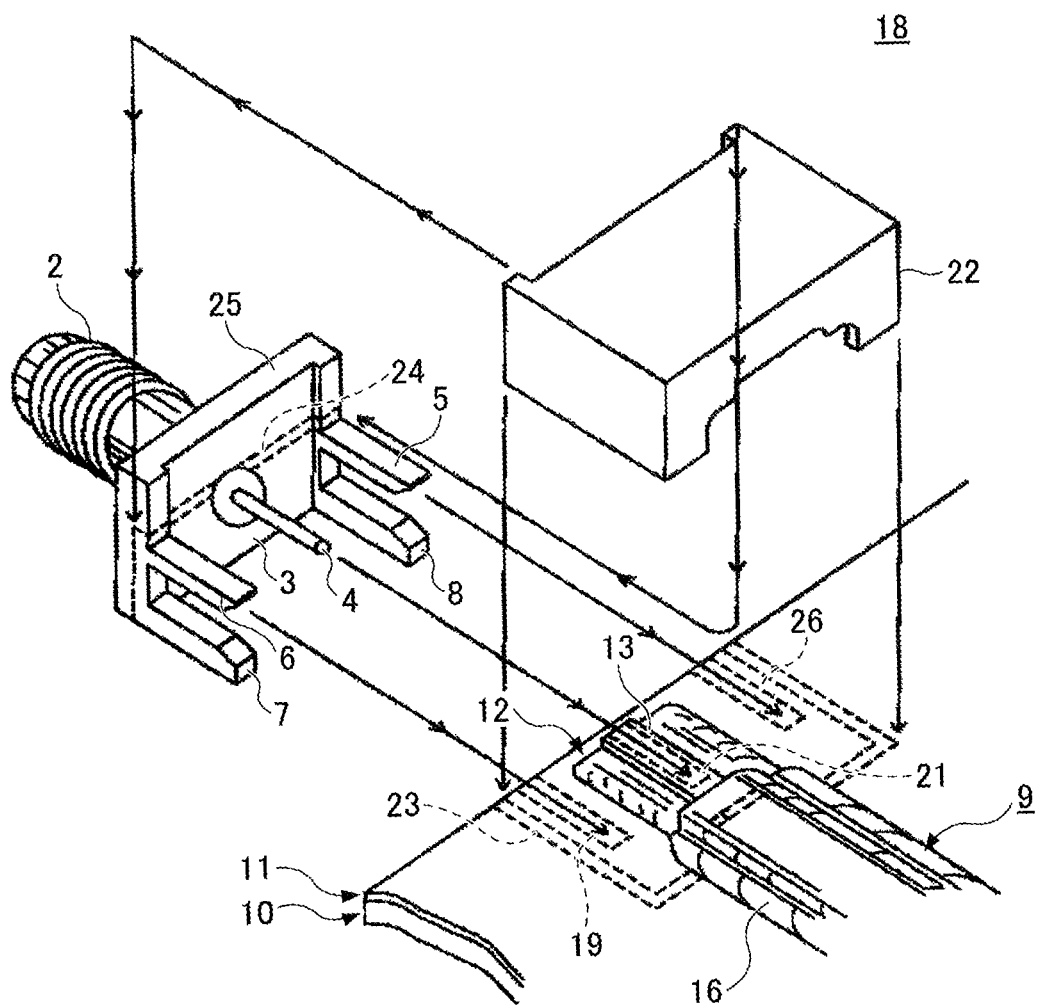
FIG. 1 is an exploded view of a structure disclosed in the patent document No. 1.
Figure 2:
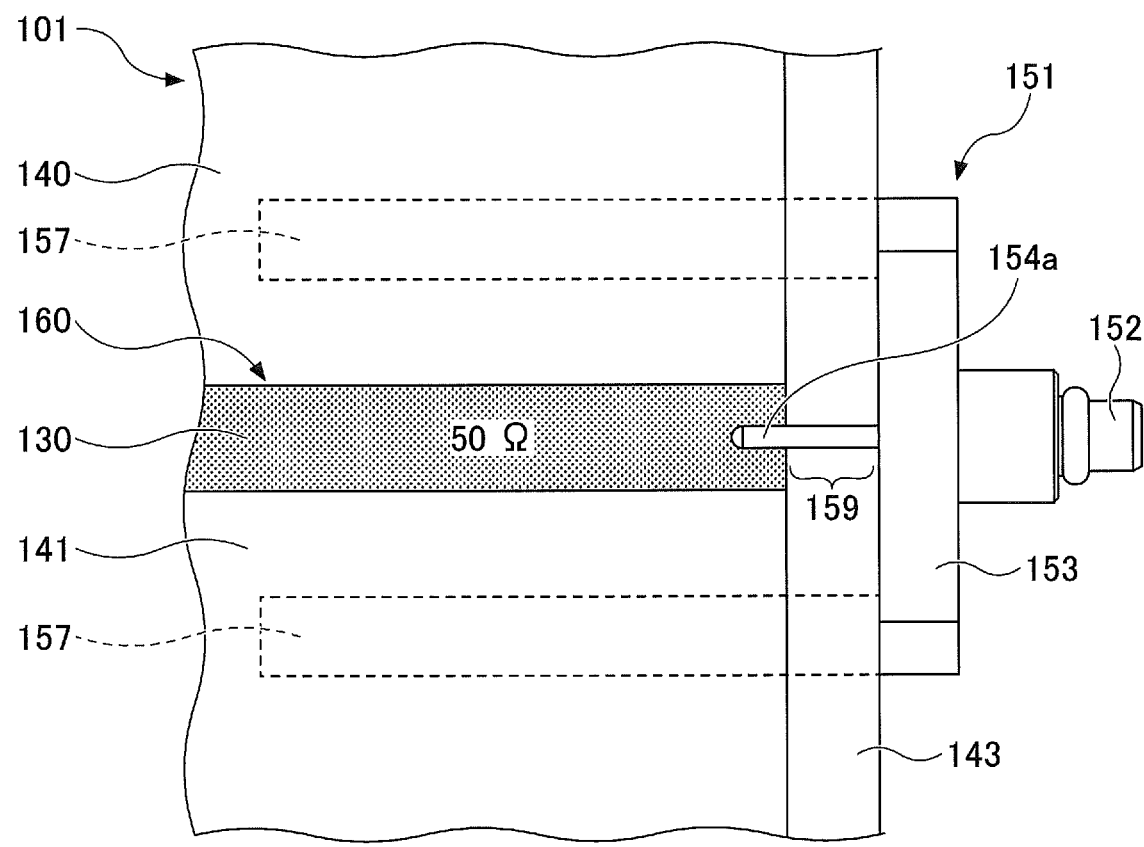
FIG. 2 is a partial magnified view depicting a substrate with a coaxial connector in plan view in one comparative example.
Figure 3:
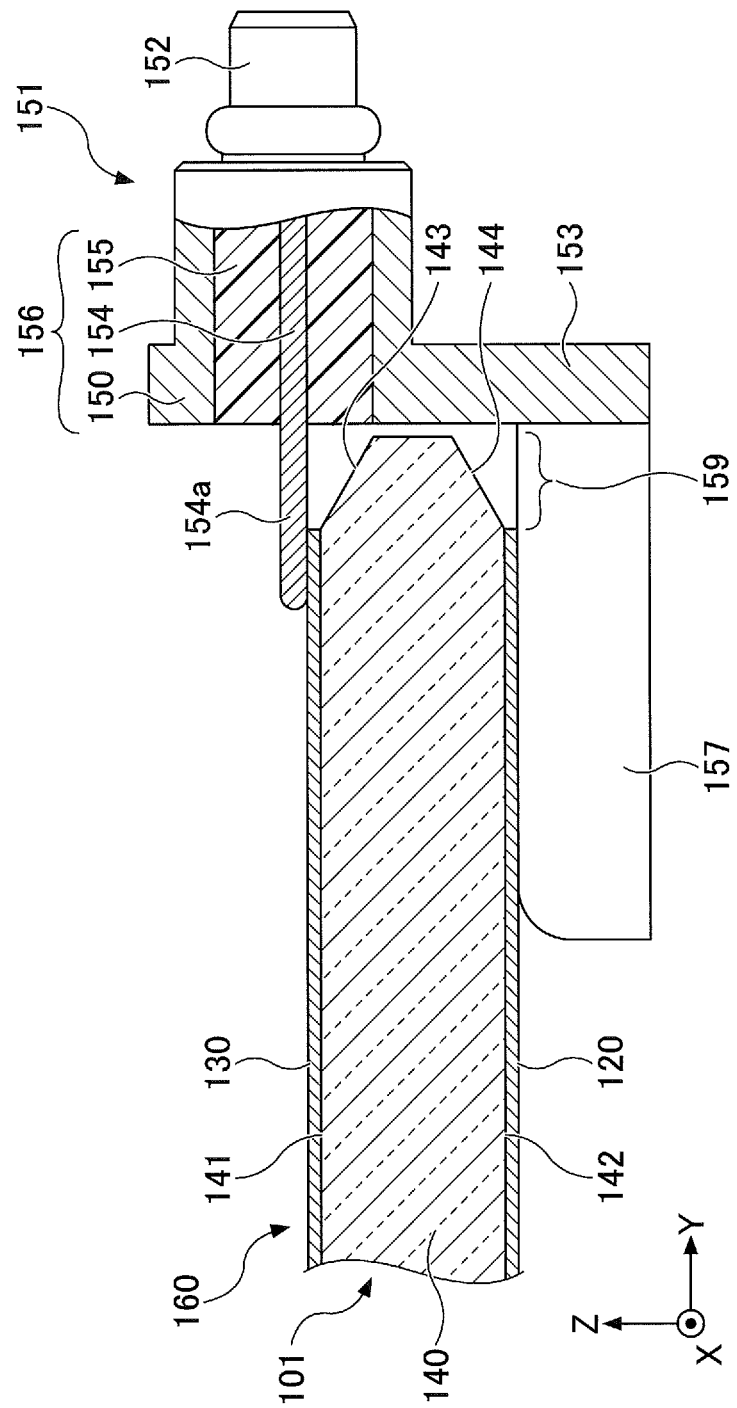
FIG. 3 is a partial cross-sectional view of the substrate with the coaxial connector in the comparative example.

FIG. 2 is a partially magnified plan view depicting a substrate with a coaxial connector in one comparative example. FIG. 3 is a partial cross-sectional view of the substrate with the coaxial connector in the comparative example. FIGS. 2 and 3 depict a configuration in which a coaxial connector 151 is attached to an edge of a substrate 101.

In FIGS. 2 and 3, the substrate 101 includes a plate-like dielectric layer 140, a strip conductor 130 provided on one side of the dielectric layer 140, and a ground conductor 120 opposing the strip conductor 130 via the dielectric layer 140. A transmission line 160 is formed on the substrate 101.

The transmission line 160 is a microstrip line having a structure that includes the dielectric layer 140, the strip conductor 130 formed on a first principal surface 141 of the dielectric layer 140, and the ground conductor 120 formed on a second principal surface 142 of the dielectric layer 140. The strip conductor 130 is a planar conductor pattern whose surface is parallel to an XY plane and is formed on the first principal surface 141. The ground conductor 120 is a conductor pattern whose surface is parallel to the XY plane and is a conductor pattern formed on the second principal surface 142.

The coaxial connector 151 includes a base 153, a coaxial structure 156 provided in the base 153, and a pair of protrusions 157 projecting from the base 153.

The coaxial structure 156 has a configuration in which the dielectric 155 is between a central conductor 154 and an outer conductor 150. One end of the coaxial structure 156 is provided with a connecting section 152 to which an end of a coaxial cable, not depicted, is connected. The central conductor 154 has a contact portion 154a that extends from the other end opposite to the connecting section 152. The contact portion 154a is in contact with the strip conductor 130 formed on the first principal surface 141 of the substrate 101 that is inserted toward the base 153 between the contact portion 154a and the pair of protrusions 157. The pair of protrusions 157 protrude from the X-axis ends of the base 153 toward the substrate 101, i.e., in the direction opposite to the Y-axis direction.

The coaxial connector 151 is attached to the substrate 101 with the contact portion 154a conductively in contact with the strip conductor 130. This way of attaching the coaxial connector 151 to the substrate 101 allows for transmission of a high frequency signal between the transmission line 160 formed on the substrate 101 and a coaxial cable not depicted whose one end is connected to the connecting section 152 of the coaxial connector 151.

However, an outer edge portion 159 located at an edge of the substrate 101 may often have slopes 143 and 144 formed by chamfering. The slope 143 is a portion of the outer edge portion 159 at which the first principal surface 141 side is chamfered, and the strip conductor 130 is not formed. The slope 144 is a portion of the outer edge portion 159 at which the second principal surface 142 side is chamfered, and the ground conductor 120 is not formed. Thus, the outer edge portion 159 between the transmission line 160 and the coaxial connector 151 has the slopes 143 and 144 formed from chamfering of the dielectric layer 140 used in the transmission line 160, and the ground conductor 120 is not formed at the portion of the outer edge portion 159 where the second principal surface 142 side is chamfered. Therefore, the characteristic impedance of the outer edge portion 159 differs significantly between the transmission line 160 and the coaxial connector 151. Therefore, there is an unshielded portion adjacent to the outer edge portion 159 where unwanted signal radiation may occur. Thus, characteristic impedance discontinuity occurring due to the outer edge portion 159 between the transmission line 160 and the coaxial connector 151 may be increased and propagation characteristics of a signal between the substrate 101 and the coaxial connector 151 may be degraded.

Figure 4:
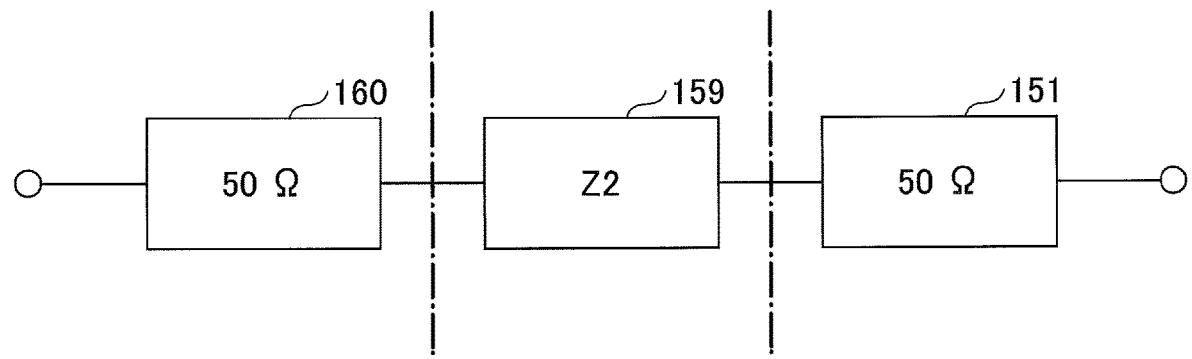
FIG. 4 is a view illustrating a characteristic impedance of a signal path of the substrate with the coaxial connector in the comparative example.

FIG. 4 is a diagram illustrating a characteristic impedance of a signal path of a substrate with a coaxial connector in the comparative example. For example, suppose that each of a characteristic impedance of the transmission line 160 formed on the substrate 101, a characteristic impedance of the coaxial connector 151, and a characteristic impedance of a coaxial cable connected to the coaxial connector 151 is 50Ω. In this case, as described above, at least the contact portion 154a is not shielded, and also, an impedance section Z2 having a characteristic impedance different from 50Ω is generated between the transmission line 160 and the coaxial connector 151. When the impedance section Z2 where the characteristic impedance is discontinuous is present between the substrate 101 and the coaxial connector 151, multiple reflections of a signal that is transmitted may occur, resulting in degradation in the propagation characteristics of the signal (e.g., an increase in the transmission loss).

On the other hand, according to the present embodiments, a coaxial connector and a substrate with a coaxial connector have configurations that can avoid degradation in the signal propagation characteristics between the substrate and the coaxial connector. Now, a configurations of coaxial connectors and substrates with coaxial connectors according to the present embodiments will be described in detail.

Figure 5:
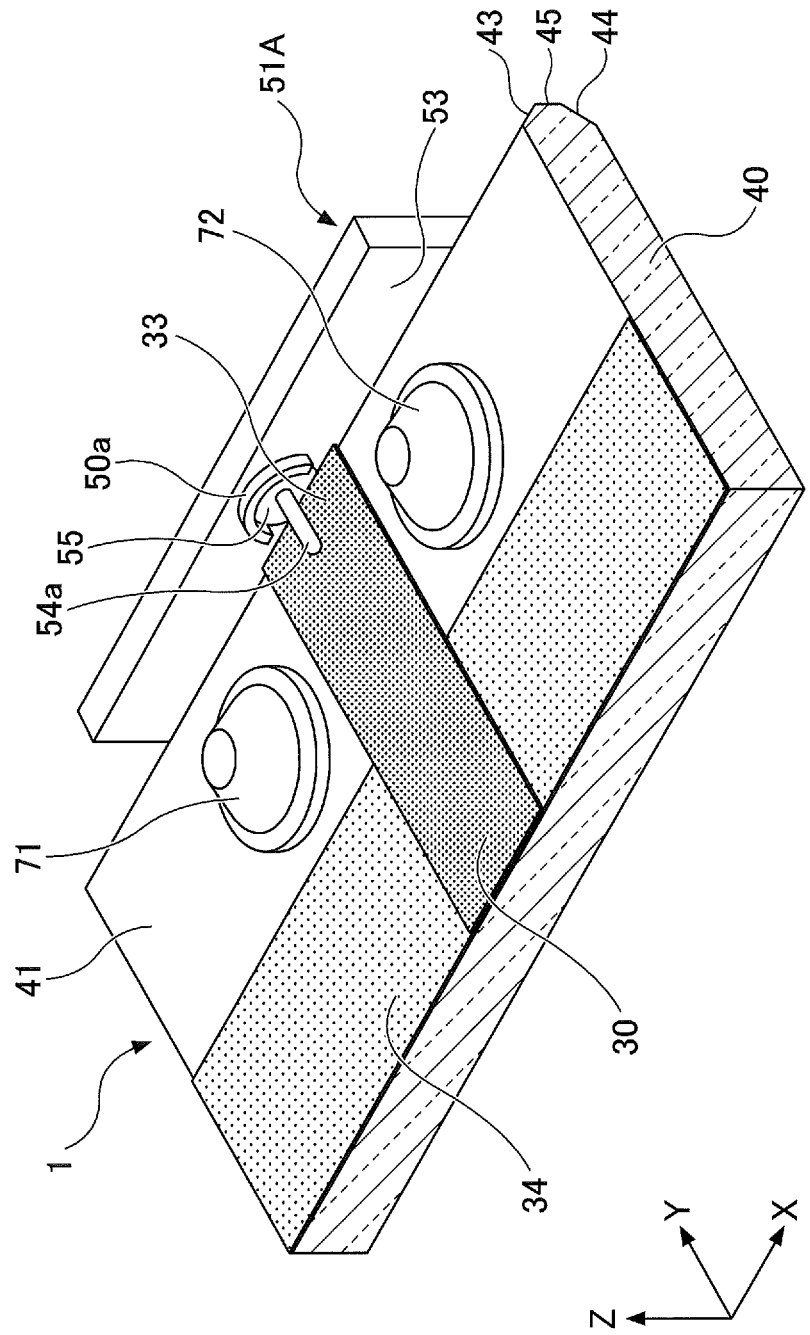
FIG. 5 is a partial magnified perspective view depicting a substrate with a coaxial connector according to a first embodiment.
Figure 6:
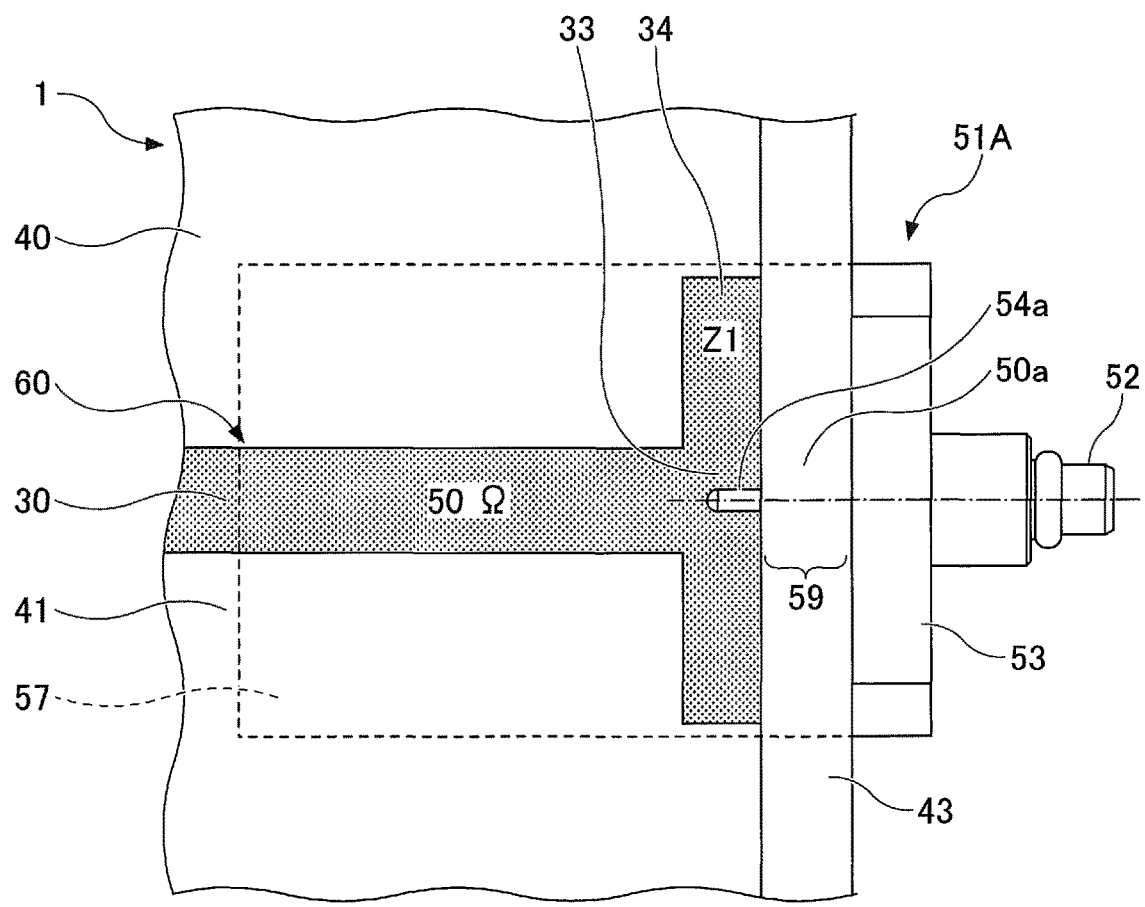
FIG. 6 is a partial magnified plan view depicting the substrate with the coaxial connector according to the first embodiment.
Figure 7:
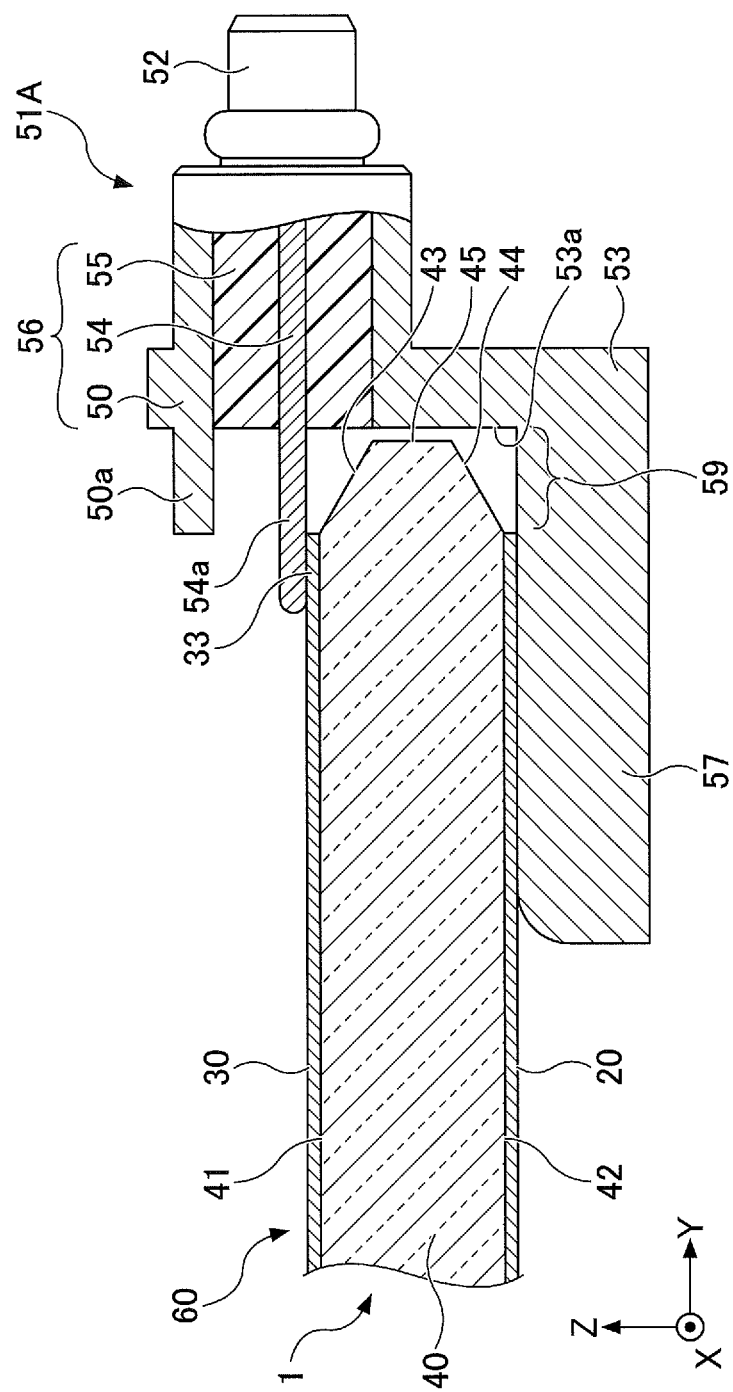
FIG. 7 is a partial cross-sectional view of the substrate with the coaxial connector according to the first embodiment.

FIG. 5 is a partial magnified perspective view depicting a coaxial connector and a substrate with the coaxial connector according to a first embodiment. FIG. 6 is a partially magnified plan view depicting the substrate with the coaxial connector according to the first embodiment. FIG. 7 is a partial cross-sectional view of the substrate with the coaxial connector according to the first embodiment. FIGS. 5-7 depict a configuration in which the coaxial connector 51A is attached to an edge of the substrate 1.

In FIGS. 5-7, the substrate 1 includes a plate-like dielectric layer 40, a strip conductor 30 provided on one side of the dielectric layer 40, and a ground conductor 20 opposite to the strip conductor 30 via the dielectric layer 40. A transmission line 60 is formed in the substrate 1.

The transmission line 60 is a microstrip line having a structure including the dielectric layer 40, the strip conductor 30 formed on a first principal surface 41 of the dielectric layer 40, and the ground conductor 20 formed on a second principal surface 42 of the dielectric layer 40.

The dielectric layer 40 has the first principal surface 41 and the second principal surface 42 opposite to the first principal surface 41. FIGS. 5 and 6 depict the strip conductor 30 provided on the first principal surface 41 side of the dielectric layer 40. FIG. 7 depicts the ground conductor 20 disposed on the second principal surface 42 side of the dielectric layer 40. The first principal surface 41 is an example of a first surface of the dielectric layer. The second principal surface 42 is an example of a second surface opposite the first surface of the dielectric layer.

The dielectric layer 40 is a plate-like or sheet-like substrate mainly containing dielectric. Both the first principal surface 41 and the second principal surface 42 are parallel to the XY plane. The dielectric layer 40 may be, for example, a dielectric substrate or a dielectric sheet. Examples of a material of the dielectric layer 40 include, but are not limited to, glasses such as quartz glass, soda-lime glass, alkalifree glass, aluminosilicate glass, borosilicate glass, alkaline borosilicate glass, and the like, ceramics, fluororesins such as polytetrafluoroethylene, liquid crystal polymers, cycloolefin polymers, polycarbonates, and the like.

The material of the dielectric layer 40 may be a transparent dielectric member through which visible light is transmitted, for example, to improve designability. A translucent dielectric member may be used instead of the transparent dielectric member. Transmittance with respect to visible light of the dielectric layer 40 is preferably greater than or equal to 30%, more preferably greater than or equal to 50%, yet more preferably greater than or equal to 70%, especially preferably greater than or equal to 80%, and most preferably greater than or equal to 90%, in order to avoid blockage of visible light.

The strip conductor 30 is a planar conductor pattern whose surface is parallel to the XY plane. The strip conductor 30 is a conductor pattern formed on the first principal surface 41 and may be formed of a conductor sheet or a conductor substrate disposed on the first principal surface 41. Examples of the material of the conductor used in the strip conductor 30 include, but are not limited to, gold, silver, copper, platinum, aluminum, chromium, and the like. The strip conductor 30 is an example of a signal line in contact with the dielectric layer 40. For example, in the case where the transmission line 60 is a microstrip line, the strip conductor 30 corresponds to a strip conductor.

The strip conductor 30 may be formed on the first principal surface 41 side via an interlayer such as polyvinyl butyral or ethylene vinyl acetate, or an adhesive layer such as an optically clear adhesive (OCA). The strip conductor 30 may be also in direct contact with the first principal surface 41.

In the first embodiment, the strip conductor 30 is a solid pattern of an area that has transmittance with respect to visible light lower than transmittance with respect to visible light of the dielectric layer 40. For example, the entire strip conductor 30 is made of an opaque planar conductor.

The strip conductor 30 may be a conductor pattern having a mesh shape such that thus-formed lattice-like apertures improve designability. The mesh structure improves transmittance with respect to visible light and allows both designability and conductivity to be achieved. The strip conductor 30 may be the same as or differ from the dielectric layer 40 in transmittance with respect to visible light.

The ground conductor 20 is a pattern of a conductor whose surface is parallel to the XY plane. The ground conductor 20 is a conductor pattern formed on the second principal surface 42 side and may be formed of a conductor sheet or a conductor substrate disposed on the second principal surface 42 side. Examples of the material of the ground conductor 20 include, but are not limited to, gold, silver, copper, platinum, aluminum, chromium, and the like. The ground conductor 20 is in contact with the dielectric layer 40.

The ground conductor 20 may be formed on the second principal surface 42 side via an interlayer such as polyvinyl butyral or ethylene vinyl acetate, or an adhesive layer such as an optically clear adhesive (OCA). The ground conductor 20 may be also in direct contact with the second principal surface 42.

The ground conductor 20 is a solid pattern of an area that has transmittance with respect to visible light lower than the transmission with respect to visible light of the dielectric layer 40. For example, the entire ground conductor 20 is made of an opaque planar conductor.

The ground conductor 20 may be a pattern of a conductor having a mesh shape such that thus-formed lattice-like apertures improve designability. The mesh structure improves transmittance with respect to visible light and allows both designability and conductivity to be achieved. The ground conductor 20 may be the same as or differ from the dielectric layer 40 in transmittance with respect to visible light.

The coaxial connector 51A includes a base 53, a coaxial structure 56 provided in the base 53, and a protrusion 57 protruding from a base surface 53a of the base 53.

In the first embodiment, the base 53 has the base surface 53a parallel to the ZX plane. The base surface 53a is a portion facing an end surface 45 of the substrate 1. The end surface 45 is a portion in the Y-axis direction, which is perpendicular to the direction normal to the substrate 1 (in this case, the Z-axis direction).

The coaxial structure 56 has a configuration in which a dielectric 55 is between a central conductor 54 and an outer conductor 50. One end of the coaxial structure 56 is provided with a connecting section 52, to which an end of a coaxial cable, not depicted, is connected. The connecting section 52 may have, for example, a male threaded shape. The central conductor 54 has a contact portion 54a which extends from the other end of the coaxial structure 56 opposite to the connecting section 52.

The contact portion 54a protrudes from the base surface 53a of the base 53. The expression that "the contact portion 54a protrudes from the base surface 53a" means that the contact portion 54a protrudes toward the substrate 1 with respect to a ZX plane including the base surface 53a. In the first embodiment, the base surface 53a is coplanar with one end surface of the dielectric 55 included in the coaxial structure 56. However, as long as the contact portion 54a protrudes from the base surface 53a, the base surface 53a may be at a position shifted along the Y-axis direction or the direction opposite thereto with respect to the end surface of the dielectric 55.

When the substrate 1 is inserted between the contact portion 54a and the protrusion 57 toward the base surface 53a, the contact portion 54a is electrically in contact with the strip conductor 30 formed on the first principal surface 41 of the inserted substrate 1 at a strip conductor end 33. It is preferable that the contact portion 54a and the strip conductor 30 be electrically connected through a conductive connection implemented by a conductive adhesive, a solder, or the like.

The protrusion 57 protrudes from the base surface 53a of the base 53. The expression that "the protrusion 57 protrudes from the base surface 53a" means that the protrusion 57 protrudes toward the substrate 1 with respect to a ZX plane including the base surface 53a. One or more protrusions may be provided as the protrusion 57.

The protrusion 57 is a conductor having the same electrical potential as the outer conductor 50 of the coaxial structure 56, for example. Accordingly, when the substrate 1 is inserted between the contact portion 54a and the protrusion 57 toward the base surface 53a, the ground conductor 20 in contact with the protrusion 57 can have the same electrical potential as the electrical potential of the outer conductor 50. The protrusion 57 may be a member integrally formed with the base 53 or a separate member connected to the base 53.

The protrusion 57 may, for example, be a portion that supports, from the lower side (from the lower side with respect to the Z-axis direction), the substrate 1 inserted between the contact portion 54a and the protrusion 57 toward the base surface 53a. In this case, the protrusion 57 is a part of an attaching structure for attaching the coaxial connector 51A to an edge of substrate 1.

It should be noted that the attaching structure for attaching the coaxial connector 51A to the edge of the substrate 1 may be any attaching structure as long as the advantageous effects of the present invention are not impaired. For example, as depicted in FIG. 5, the attaching structure may be configured to tighten the substrate 1 to the protrusion 57 by bolts 71 and 72 inserted into through holes formed in the substrate 1. Washers or a portion of the base 53 may be inserted between the first principal surface 41 and the bolts 71 and 72 to prevent direct contact between the bolts 71 and 72 and the substrate 1.

The coaxial connector 51A is attached to the substrate 1 with the contact portion 54a electrically conductively in contact with the strip conductor 30. As a result of the coaxial connector 51A being attached to the substrate 1 in this manner, a high frequency signal can be transmitted between the transmission line 60 formed in the substrate 1 and a coaxial cable (not depicted) whose one end is connected to the connecting section 52 of the coaxial connector 51A.

However, as described above, an outer edge portion 59 located at an edge of the substrate 1 often has slopes 43 and 44 formed by chamfering. The first slope 43 is a portion of the outer edge portion 59, in which the first principal surface 41 side is chamfered, and the strip conductor 30 is not formed. The second slope 44 is a portion of the outer edge portion 59, in which the second principal surface 42 is chamfered, and the ground conductor 20 is not formed.

The outer conductor 50 in the first embodiment has a protruding conductor 50a that protrudes from the base surface 53a and is not in contact with the substrate 1 inserted between the contact portion 54a and the protrusion 57. The expression "the protruding conductor 50a that protrudes from the base surface 53a" means that the protruding conductor 50a protrudes toward the substrate 1 with respect to a ZX plane including the base surface 53a. In the first embodiment, there is a space along the direction normal to the substrate 1 between the protruding conductor 50a and the slope 43.

By thus providing the protruding conductor 50a, at least the contact portion 54a can be shielded by the protruding conductor 50a. Therefore, discontinuity of characteristic impedance occurring due to the outer edge portion 59 between the transmission line 60 and the coaxial connector 51A is reduced, and it is possible to avoid degradation in the propagation characteristics of a signal between the substrate 1 and the coaxial connector 51A. For example, multiple reflection of a signal transmitted between the substrate 1 and the coaxial connector 51A comes to be not likely to occur, and an increase in transmission loss can be avoided.

In the first embodiment, the protruding conductor 50a protrudes from the base surface 53a in such a manner that the contact portion 54a is positioned between the substrate 1, inserted between the contact portion 54a and the protrusion 57, and the protruding conductor 50a protruding from the base surface 53a. This prevents an unwanted signal from emitting in a direction opposite to the substrate 1 with respect to the contact portion 54a. For example, the protruding conductor 50a is an eave-like portion extending from the coaxial structure 56 in a direction parallel to an axial direction of the coaxial structure 56 and has the same electric potential as the electric potential of the outer conductor 50.

When viewed in a direction normal to the substrate 1 with the substrate 1 inserted between the contact portion 54a and the protrusion 57, the protruding conductor 50a preferably protrudes from the base surface 53a in such a manner that the protruding conductor 50a overlaps the outer edge portion 59. Thereby, it is possible to further reduce discontinuity of characteristic impedance, occurring due to the outer edge portion 59, between the transmission line 60 and the coaxial connector 51A, and it is possible to further avoid degradation in the propagation characteristics of a signal between the substrate 1 and the coaxial connector 51A.

The protruding conductor 50a may protrude from the base surface 53a as far as a boundary between the strip conductor 30 (strip conductor end 33) and the outer edge portion 59, or may protrude beyond the boundary, when viewed from a direction normal to the substrate 1. Protruding of the protruding conductor 50a from the base surface 53a up to or beyond the boundary reduces discontinuity of characteristic impedance, occurring due to the outer edge portions 59, between the transmission line 60 and the coaxial connector 51A, as compared to protruding of the protruding conductor 50a from the base surface 53a stopping short of the boundary. Thus, degradation in the propagation characteristics of a signal between the substrate 1 and the coaxial connector 51A can be further avoided.

It is preferable that, when viewed from a direction normal to the substrate 1 with the substrate 1 inserted between the contact portion 54a and the protrusion 57, the protrusion 57 protrudes from the base surface 53a in such a manner that the protrusion 57 overlaps the contact portion 54a. Thereby, it is possible to further reduce discontinuity of the characteristic impedance, occurring due to the outer edge portion 59, between the transmission line 60 and the coaxial connector 51A, and it is possible to further avoid degradation in the propagation characteristics of a signal between the substrate 1 and the coaxial connector 51A.

The protrusion 57 may protrude from the base surface 53a as far as a distal end of the contact portion 54a or protrude beyond the distal end of the contact portion 54a, when viewed from a direction normal to the substrate 1. The protrusion 57 protruding from the base surface 53a up to or beyond the distal end can reduce discontinuity of the characteristic impedance, occurring due to the outer edge portion 59, between the transmission line 60 and the coaxial connector 51A, compared to protruding of the protrusion 57 from the base surface 53a stopping short of the distal end. Thus, degradation in the propagation characteristics of a signal between the substrate 1 and the coaxial connector 51A can be further avoided.

It is preferable that a degree of parallelization of the end surface 45 with respect to the base surface 53a be smaller than or equal to 100 μm, and more preferably, be smaller than or equal to 50 μm, in order to avoid degradation in the propagation characteristics of a signal between the substrate 1 and the coaxial connector 51A. A calculated mean roughness Ra of the end surface 45 is preferably smaller than or equal to 3.2 μm, and more preferably, smaller than or equal to 1.6 μm, in order to avoid degradation in the propagation characteristics of a signal between the substrate 1 and the coaxial connector 51A. This is because a length of a portion of the contact portion 54a not in contact with the strip conductor 30 in a state in which the end surface 45 and the base surface 53a are in contact with one another can be managed with a high degree of accuracy. Therefore, it is possible to avoid a degradation in the advantageous effects of the protruding conductor 50a to reduce discontinuity of characteristic impedance occurring due to the outer edge portion 59 between the transmission line 60 and the coaxial connector 51A, and it is possible to avoid a degradation in the advantageous effects of shielding an unwanted signal emission, such degradations otherwise possibly occurring due to a dimension error possibly occurring during an attaching process. The calculated mean roughness Ra is a value defined by JIS B 0601: 2001.

As depicted in FIGS. 5 and 6, an impedance adjusting portion 34 for implementing impedance matching may be provided at a portion of (at a location pathway along) the transmission line 60 such as a microstrip line. FIG. 5 depicts an example in which the impedance adjusting portion 34 is separated from the slope 43, and FIG. 6 depicts an example in which the impedance adjusting portion 34 is in contact with the slope 43.

By providing the impedance adjusting portion 34 at a portion of the transmission line 60, the advantageous effects of reducing discontinuity in characteristic impedance occurring due to the outer edge portion 59 between the transmission line 60 and the coaxial connector 51A are improved than a case where the impedance adjusting portion 34 is not provided. Therefore, it is possible to further avoid degradation in the propagation characteristics of a signal between the substrate 1 and the coaxial connector 51A.

For example, as depicted in FIG. 5 or FIG. 6, the impedance adjusting portion 34 may be implemented by stubs branching from the strip conductor 30 on the first principal surface 41 of the substrate 1. The stubs are distribution-element circuits connected at locations pathway along the transmission line 60. Patterns of the stubs are formed, for example, in the same manner as a pattern of the strip conductor 30. As depicted in FIG. 5 or 6, by forming the stubs laterally symmetrical with respect to the longitudinal direction of the strip conductor 30, for example, influences of the stubs on directivity of an antenna conductor, not depicted, connected at the distal ends of the transmission line 60, can be reduced.

The impedance adjusting portion 34 may include a matching circuit formed of a lumped-element circuit using a reactance element such as an inductor or a capacitor.

Figure 8:
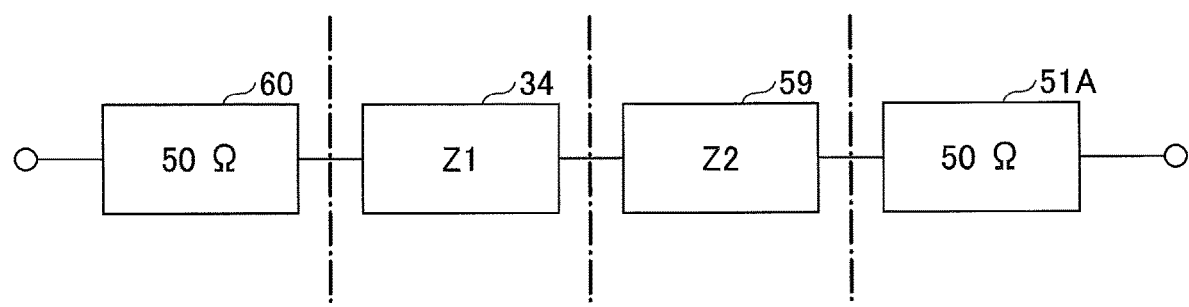
FIG. 8 is a diagram illustrating a characteristic impedance of a signal path of the substrate with the coaxial connector according to the first embodiment.

FIG. 8 is a diagram illustrating characteristic impedances of signal paths with respect to the substrate with the coaxial connector according to the first embodiment. For example, suppose that each of characteristic impedance of the transmission line 60 formed on the substrate 1, characteristic impedance of the coaxial connector 51A, and characteristic impedance of a coaxial cable connected to the coaxial connector 51A is 50Ω. By providing the impedance adjusting portion 34, an impedance section Z1 can be formed between the transmission line 60 and the outer edge portion 59. The impedance section Z1 being thus formed compensates for a change in characteristic impedance caused by the outer edge portion 59. Therefore, it is possible to reduce discontinuity of characteristic impedance between the transmission line 60 and the coaxial connector 51A, and avoid degradation in the propagation characteristics of a signal between the substrate 1 and the coaxial connector 51A.

Figure 9:
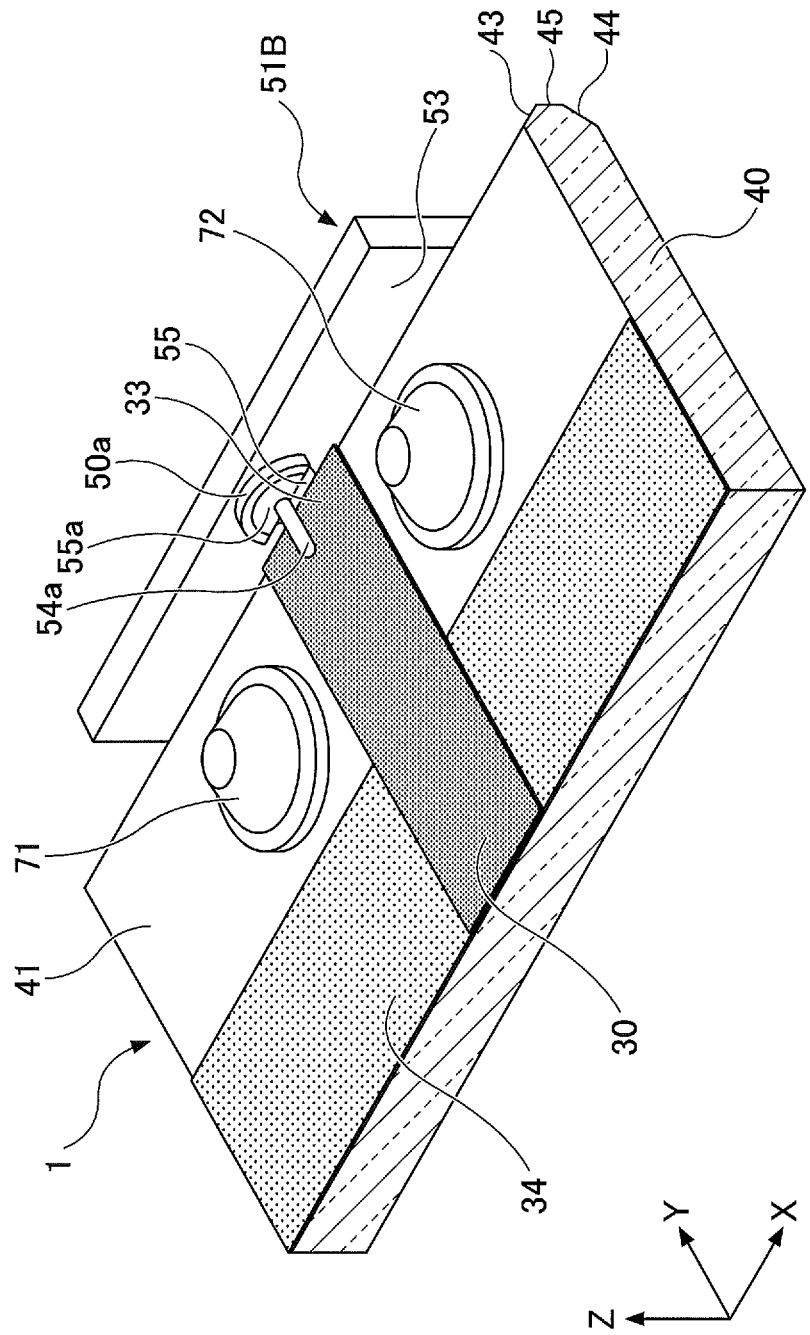
FIG. 9 is a partial magnified perspective view depicting a substrate with a coaxial connector according to a second embodiment.
Figure 10:
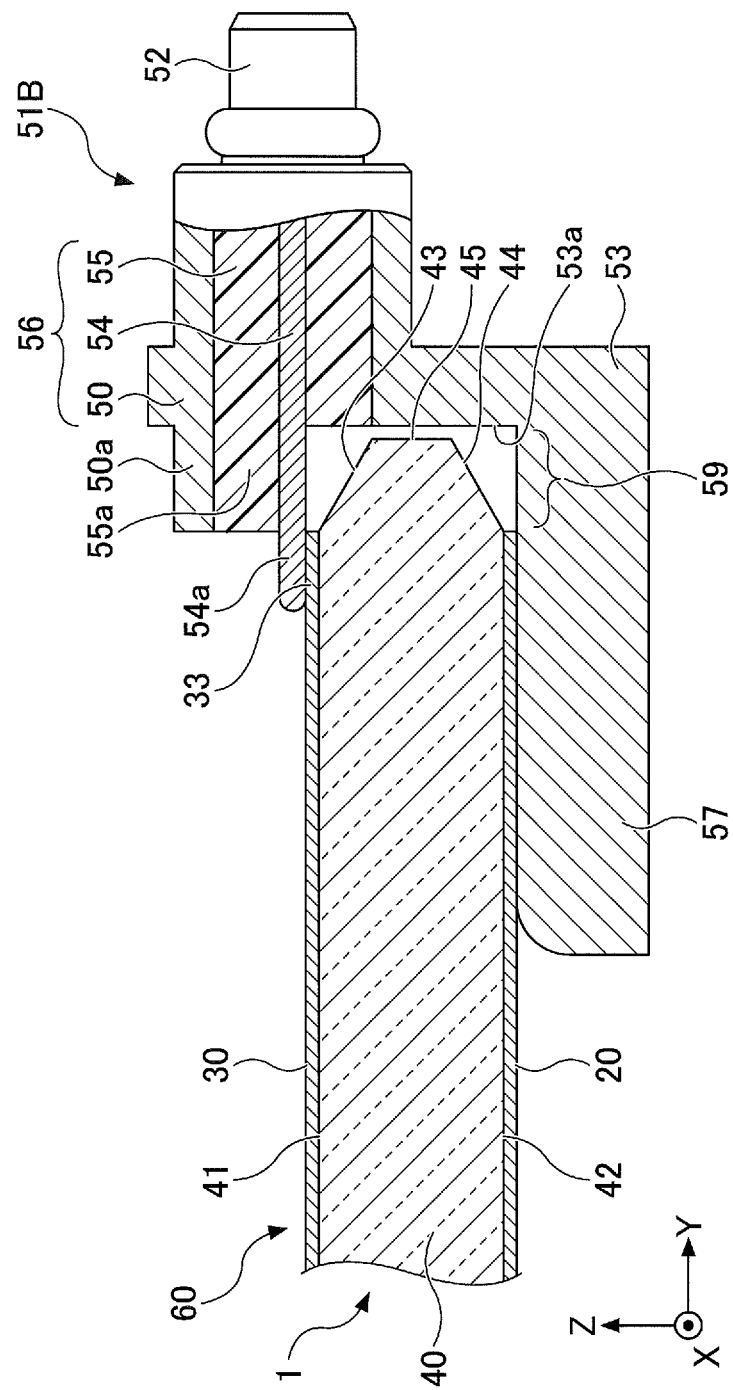
FIG. 10 is a partial cross-sectional view of the substrate with the coaxial connector according to the second embodiment.

FIG. 9 is a partially magnified perspective view depicting a coaxial connector and a substrate with the coaxial connector view according to a second embodiment. FIG. 10 is a partial cross-sectional view of the substrate with the coaxial connector according to the second embodiment. FIGS. 9 and 10 depict a configuration in which the coaxial connector 51B is attached to an edge of the substrate 1. The descriptions of the structures and the advantageous effects of the second embodiment similar to those of the first embodiment will be omitted or simplified by reference to the descriptions hereinbefore. In the second embodiment, a protruding dielectric 55a is added to the first embodiment.

A dielectric 55 in the second embodiment has the protruding dielectric 55a protruding from a base surface 53a toward between a contact portion 54a and a protruding conductor 50a. The expression "the protruding dielectric protruding from a base surface 53a" means that the protruding dielectric 55a protrudes toward the substrate 1 with respect to a ZX plane including the base surface 53a.

By providing the protruding dielectric 55a, discontinuity of characteristic impedance occurring due to an outer edge portions 59 between a transmission line 60 and a coaxial connector 51B is reduced, and degradation in the propagation characteristics of a signal between the substrate 1 and the coaxial connector 51B is avoided. For example, multiple reflection of a signal transmitted between the substrate 1 and the coaxial connector 51B comes to be not likely to occur, and an increase in transmission loss can be avoided. In the second embodiment, the protruding dielectric 55a is an eave-like portion extending from a coaxial structure 56 in a direction parallel to an axial direction of the coaxial structure 56.

In the second embodiment, the protruding dielectric 55a is in contact with at least one of the contact portion 54a and the protruding conductor 50a. Thus, discontinuity of characteristic impedance occurring due to the outer edge portion 59 between the transmission line 60 and the coaxial connector 51B is reduced, and it is possible to avoid degradation in the propagation characteristics of a signal between the substrate 1 and the coaxial connector 51B. The protruding dielectric 55a may be in contact with a part of or the entirety of the contact portion 54a or in contact with a part of or the entirety of the protruding conductor 50a.

The protruding dielectric 55a may protrude from the base surface 53a as far as a boundary between a strip conductor 30 (strip conductor end 33) and the outer edge portion 59, or may protrude beyond the boundary, when viewed from a direction normal to the substrate 1. The protruding dielectric 55a protrudes from the base surface 53a to or beyond the boundary to reduce discontinuity of characteristic impedance occurring due to the outer edge portions 59 between the transmission line 60 and the coaxial connector 51B as compared to a configuration in which the protruding dielectric 55a protruding from the base surface 53a stops short of the boundary. That is, degradation in the propagation characteristics of a signal between the substrate 1 and the coaxial connector 51B can be more surely avoided.

Examples of the material of the protruding dielectric 55a include, but are not limited to, glasses such as quartz glass, soda-lime glass, alkalifree glass, aluminosilicate glass, borosilicate glass, alkali borosilicate glass, and the like, fluororesins such as polytetrafluoroethylene, liquid crystal polymers, and the like.

Figure 11:
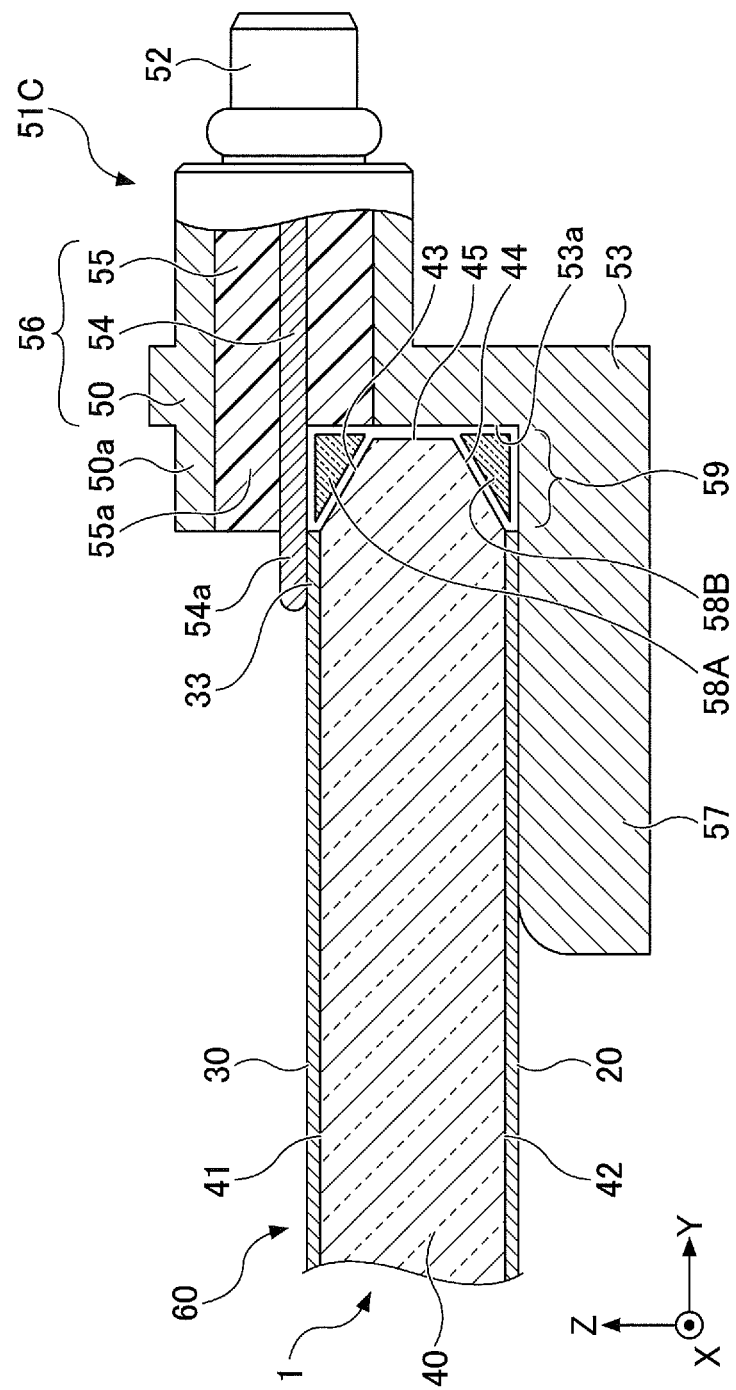
FIG. 11 is a partial cross-sectional view of a substrate with a coaxial connector according to a third embodiment.

FIG. 11 is a partial cross-sectional view of a coaxial connector and a substrate with the coaxial connector according to a third embodiment. FIG. 11 depicts a configuration in which the coaxial connector 51C is attached to an edge of the substrate 1. Concerning the third embodiments, the descriptions of the structures and the advantageous effects similar to or the same as those of the above-described embodiments will be omitted or simplified by reference to the descriptions hereinbefore. The third embodiment adds dielectric members 58A and 58B to the second embodiment.

The dielectric member 58A is a generally triangular prismatic element having a side along a slope 43, a side along a contact portion 54a, and a side along a base surface 53a. At least a portion of a space between the contact portion 54a and the slope 43 is filled with the dielectric member 58A. The dielectric member 58B is a generally triangular prismatic element having a side along a slope 44, a side along a protrusion 57, and a side along the base surface 53a. At least a portion of a space between the protrusion 57 and the slope 44 is filled with the dielectric member 58B.

By providing the dielectric members 58A and 58B, discontinuity of characteristic impedance occurring due to an outer edge portion 59 between a transmission line 60 and the coaxial connector 51C is reduced, and degradation in the propagation characteristics of a signal between the substrate 1 and the coaxial connector 51C is avoided. For example, multiple reflection of a signal transmitted between the substrate 1 and the coaxial connector 51C comes to be not likely to occur, and an increase in transmission loss is avoided.

A material of the dielectric member 58A may be similar to or have a higher dielectric constant than a dielectric constant of a dielectric layer 40. Specific examples include, but are not limited to, glasses such as quartz glass, soda-lime glass, alkalifree glass, aluminosilicate glass, borosilicate glass, alkali borosilicate glass, and the like, ceramics, fluororesins such as polytetrafluoroethylene, liquid crystal polymers, cycloolefin polymers, polycarbonates, and the like.

FIGS. 12-15 depict examples of configurations of protruding conductors and protruding dielectrics. Any of the configurations of FIGS. 12-15 are applicable to each of the embodiments described above. Each of the protruding conductor 50a and the protruding dielectric 55a depicted in each of FIGS. 12-15 protrudes from the base surface 53a to surround a portion of the outer peripheral surface of the contact portion 54a.

Figure 12:
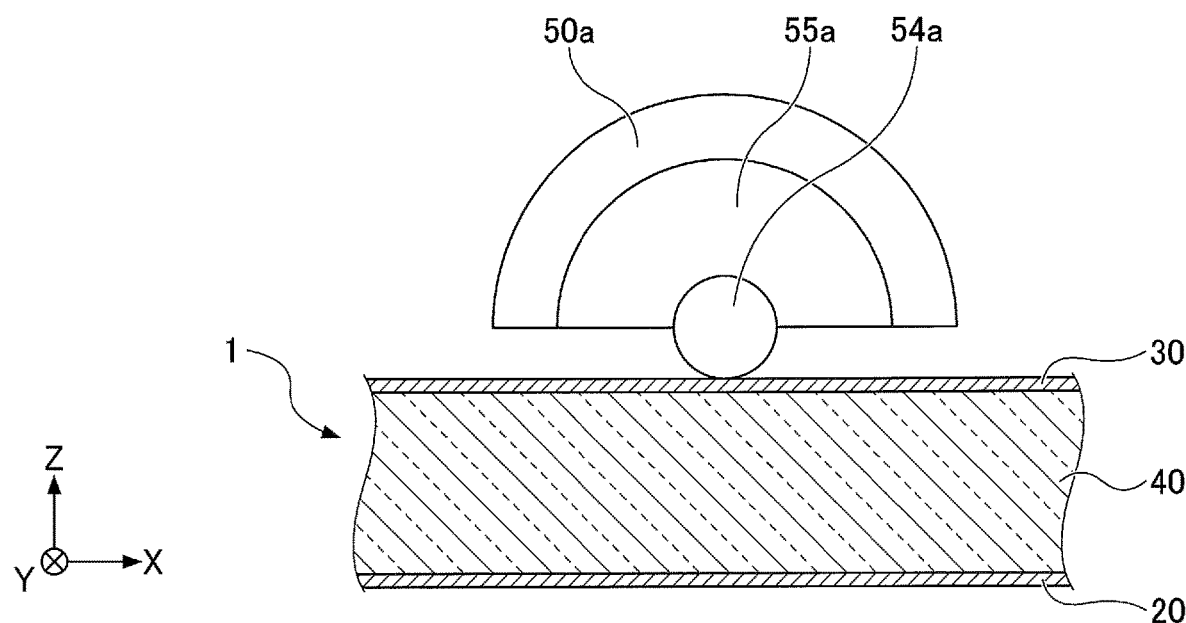
FIG. 12 depicts a first configuration example of a protruding conductor and a protruding dielectric.
Figure 13:
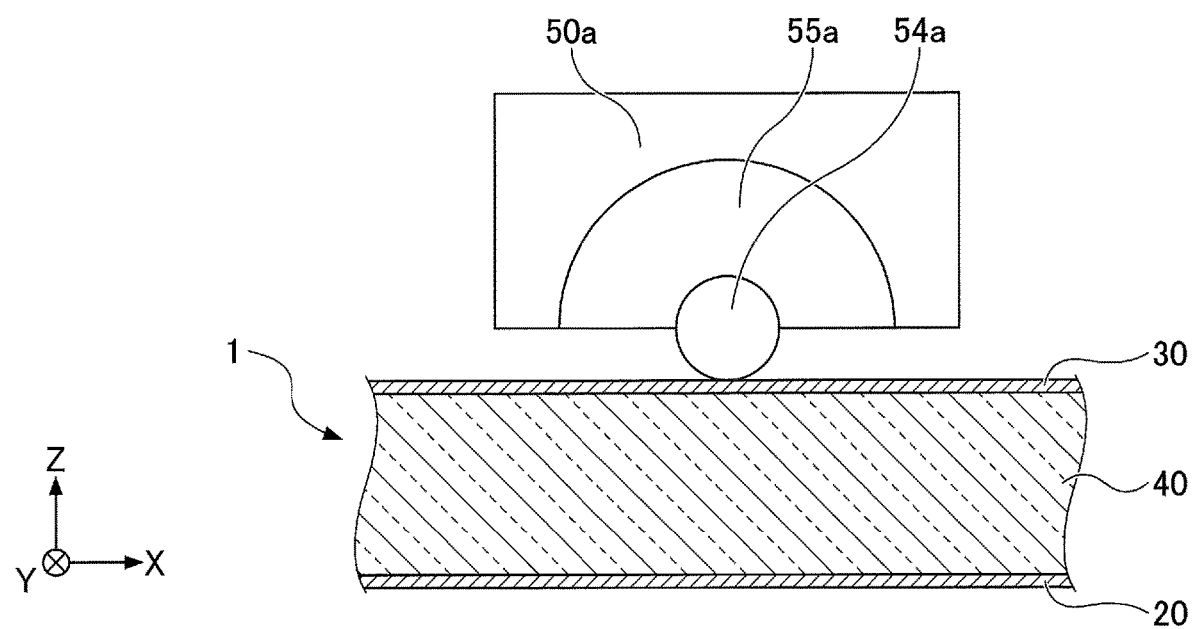
FIG. 13 depicts a second configuration example of a protruding conductor and a protruding dielectric.
Figure 14:
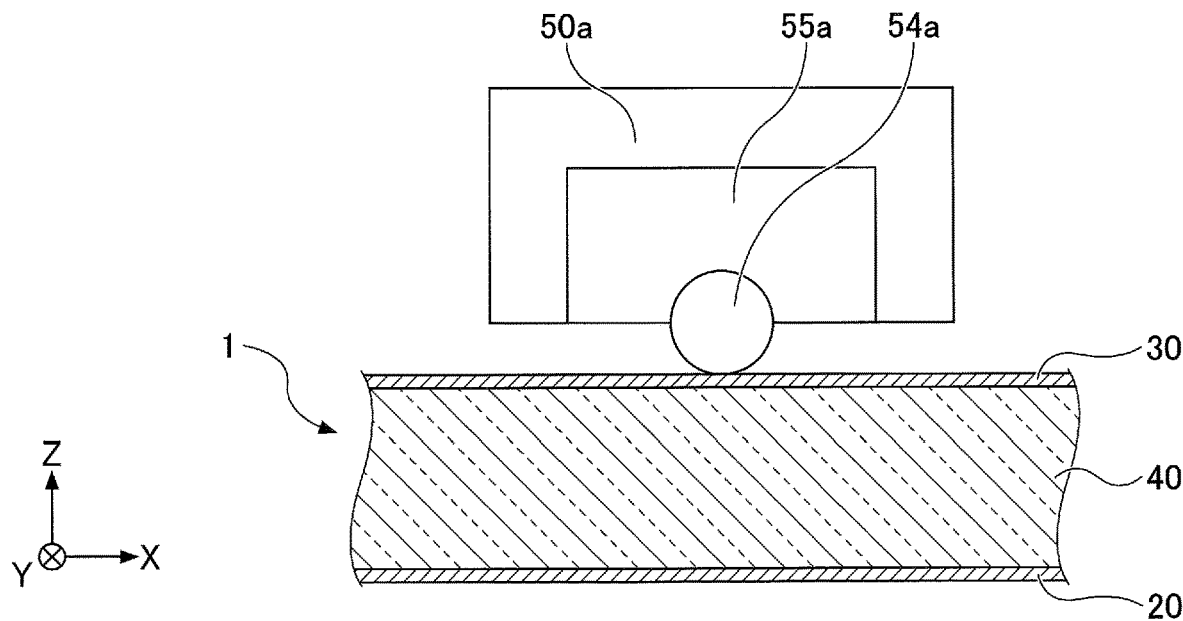
FIG. 14 depicts a third configuration example of a protruding conductor and a protruding dielectric.
Figure 15:
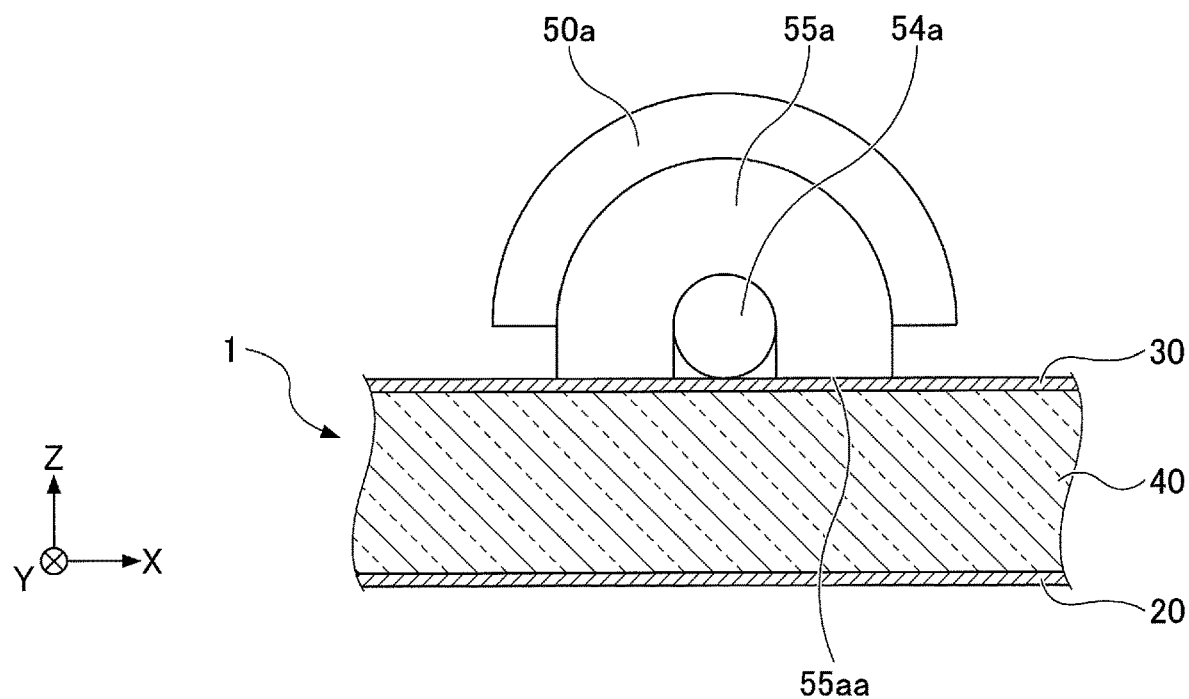
FIG. 15 depicts a fourth configuration example of a protruding conductor and a protruding dielectric.

In each of FIGS. 12 and 15, each of the protruding conductor 50a and the protruding dielectric 55a has an eave shape obtained from a circular cylinder being approximately halved. In FIG. 13, the protruding conductor 50a has an eave shape obtained from a square or rectangular cylinder being approximately halved, and the protruding dielectric 55a has an eave shape obtained from a circular cylinder being approximately halved. In FIG. 14, each of the protruding conductor 50a and the protruding dielectric 55a has an eave shape obtained from a square or rectangular cylinder being approximately halved.

Each of the protruding dielectrics 55a has an outer wall, which is in contact with an inner wall of the corresponding one of the protruding conductors 50a, and an inner wall, which is in contact with an outer peripheral surface of the contact portion 54a. As depicted in FIG. 15, the protruding dielectric 55a has a contact surface 55aa that is in contact with the first principal surface 41 of the substrate 1, so that a contact state between the contact portion 54a and the strip conductor 30 is stabilized and contact between the protruding conductor 50a and the strip conductor 30 is prevented.

Although the coaxial connectors and the substrates with the coaxial connectors have been described with reference to the embodiments, the present invention is not limited to the embodiments described above. Various modifications or improvements, such as a combination or a substitution with some or all of the other embodiments, are possible within the scope of the present invention.

For example, a transmission line formed on a substrate is not limited to a microstrip line, and may be another transmission line, such as a coplanar line or a coplanar line with a ground.

What is claimed is:

1. A coaxial connector comprising:
a base surface;
a coaxial structure where a dielectric is between a central conductor and an outer conductor; and
a protrusion protruding from the base surface,
wherein
the central conductor includes a contact portion protruding from the base surface,
in response to a substrate being inserted toward the base surface between the contact portion and the protrusion, the contact portion comes into contact with a conductor pattern formed on a surface of the substrate,
the outer conductor includes a protruding conductor protruding from the base surface and not in contact with the substrate inserted between the contact portion and the protrusion,
the substrate has an outer edge portion where the conductor pattern is not formed, and
when viewed in a direction normal to the substrate in a state where the substrate is between the contact portion and the protrusion, the protruding conductor protrudes from the base surface in such a manner that the protruding conductor overlaps the outer edge portion.

2. The coaxial connector as claimed in claim 1, wherein
the protruding conductor protrudes from the base surface in such a manner that the contact portion is between the substrate, inserted between the contact portion and the protrusion, and the protruding conductor.

3. The coaxial connector as claimed in claim 2, wherein
the protruding conductor protrudes from the base surface in such a manner that the protruding conductor partially surrounds an outer peripheral surface of the contact portion.

4. The coaxial connector as claimed in claim 3, wherein
the dielectric includes a protruding dielectric protruding from the base surface and extending between the contact portion and the protruding conductor.

5. The coaxial connector as claimed in claim 2, wherein
the dielectric includes a protruding dielectric protruding from the base surface and extending between the contact portion and the protruding conductor.

6. The coaxial connector as claimed in claim 1, wherein
the dielectric includes a protruding dielectric protruding from the base surface and extending between the contact portion and the protruding conductor.

7. A substrate with a coaxial connector comprising:
the substrate; and the coaxial connector attached to the substrate,
wherein
the coaxial connector includes:
a base surface;
a coaxial structure where a dielectric is between a central conductor and an outer conductor; and
a protrusion protruding from the base surface,
wherein
the central conductor includes a contact portion protruding from the base surface,
the contact portion is in contact with a conductor pattern formed on a surface of the substrate that is inserted toward the base surface between the contact portion and the protrusion,
the outer conductor includes a protruding conductor protruding from the base surface and not in contact with the substrate inserted between the contact portion and the protrusion,
the substrate has an end surface configured to face the base surface,
a degree of parallelization of the end surface with respect to the base surface is smaller than or equal to 100 μm, and
a calculated mean roughness Ra of the end surface is smaller than or equal to 3.2 μm.

8. The substrate with the coaxial connector as claimed in claim 7,
wherein
when viewed in a direction normal to the substrate, the protrusion protrudes from the base surface in such a manner that the protrusion overlaps the contact portion.

9. A coaxial connector comprising:
a base surface;
a coaxial structure where a dielectric is between a central conductor and an outer conductor; and
a protrusion protruding from the base surface,
wherein
the central conductor includes a contact portion protruding from the base surface,
in response to a substrate being inserted toward the base surface between the contact portion and the protrusion, the contact portion comes into contact with a conductor pattern formed on a surface of the substrate,
the outer conductor includes a protruding conductor protruding from the base surface and not in contact with the substrate inserted between the contact portion and the protrusion, and
the dielectric includes a protruding dielectric protruding from the base surface extending between the contact portion and the protruding conductor.

10. The coaxial connector as claimed in claim 9, wherein
the protruding conductor protrudes from the base surface in such a manner that the contact portion is between the substrate, inserted between the contact portion and the protrusion, and the protruding conductor.

11. The coaxial connector as claimed in claim 10, wherein
the protruding conductor protrudes from the base surface in such a manner that the protruding conductor partially surrounds an outer peripheral surface of the contact portion.

12. A substrate with a coaxial connector comprising:
the substrate; and the coaxial connector attached to the substrate,
wherein
the coaxial connector includes:
a base surface;
a coaxial structure where a dielectric is between a central conductor and an outer conductor; and
a protrusion protruding from the base surface,
wherein
the central conductor includes a contact portion protruding from the base surface, the contact portion is in contact with a conductor pattern formed on a surface of the substrate that is inserted toward the base surface between the contact portion and the protrusion, the outer conductor includes a protruding conductor protruding from the base surface and not in contact with the substrate inserted between the contact portion and the protrusion, and when viewed in a direction normal to the substrate, the protrusion protrudes from the base surface in such a manner that the protrusion overlaps the contact portion.

* * * * *